United States Patent [19]

Suko

[11] Patent Number: 5,111,084
[45] Date of Patent: May 5, 1992

[54] LOW LOSS DRAIN PULSER CIRCUIT FOR SOLID STATE MICROWAVE POWER AMPLIFIERS

[75] Inventor: Scott K. Suko, Columbia, Md.

[73] Assignee: Westinghouse Electric Corp., Pittsburgh, Pa.

[21] Appl. No.: 531,065

[22] Filed: May 31, 1990

[51] Int. Cl.⁵ .................. H03K 19/086; H03K 17/16
[52] U.S. Cl. ............................ 307/571; 307/451;
 307/296.3; 307/270; 307/584; 307/246;
 307/482; 330/156; 330/277
[58] Field of Search .......... 307/451, 296.3, 443,
 307/270, 584–585, 246, 543, 482; 330/156, 277

[56] References Cited

U.S. PATENT DOCUMENTS

| | | | |
|---|---|---|---|
| 3,286,189 | 11/1966 | Mitchell et al. | 330/156 |
| 4,484,092 | 11/1984 | Campbell, Jr. | 307/482 |
| 4,511,811 | 4/1985 | Gupta | 307/296.3 |
| 4,612,457 | 9/1986 | Prater | 307/270 |

OTHER PUBLICATIONS

IBM Tech. Disc. Bull., vol. 18, No. 12, May 1986 "Low Power Substrate Voltage Generator", 307/296.2.

Primary Examiner—Stanley D. Miller
Assistant Examiner—Margaret Rose Wambach
Attorney, Agent, or Firm—W. G. Sutcliff

[57] ABSTRACT

A drain pulsing circuit for intermittently applying electric power to the drain of a solid state amplifier uses a N-channel MOSFET as the drain switch, but does not require an external bias voltage to drive the drain switch gate. The pulsing circuit generally comprises a control input circuit for generating a control pulse, and a charge pumping circuit having a capacitor that is connected to the output of the control input circuit, and first and second complementary MOSFET switches. The capacitor in the pumping circuit stores a charge during an off cycle when the control input circuit does not generate a control pulse. However, when a control pulse is generated, the first and second complementary MOSFET switches of the pumping circuit connect the gate of the N-channel drain switch MOSFET to the voltages associated with both the capacitor charge and the control pulse (which "pumps" the capacitor to a higher charge) in order to temporarily bias the N-channel drain switch MOSFET to an "on" state. The circuit has a faster switching speed and uses less power than similar designs utilizing P-channel MOSFETs as the drain switch, which makes it useful in applications where intermittent power control is required.

20 Claims, 3 Drawing Sheets

LOW LOSS DRAIN PULSER CIRCUIT FOR SOLID STATE MICROWAVE POWER AMPLIFIERS

BACKGROUND OF THE INVENTION

This invention generally relates to a circuit for gating DC power, and is specifically concerned with a low loss pulser circuit for a solid state microwave power amplifier.

Solid state amplifiers are replacing traveling wave tube type amplifiers in modern radar transmitters. In the gigahertz range, these amplifiers are typically GaAs FETs. A typical X-band power amplifier output stage may draw 3 amps at 10 volts. For a variety of reasons, it is desirable to apply the 10 volt power signal to the drain of the microwave amplifier only during a transmit pulse. Transmit pulses may be repeated at a rate of a few hundred kilohertz and require rise and fall times of 20 nanoseconds or less.

The 10 V DC power signal is applied to the drain of the microwave amplifier by means of a drain pulser circuit. This circuit acts as a switch connecting the amplifier drain to a DC power source during each transmit pulse and quickly pulling the amplifier drain voltage to ground between pulses. This function is easily accomplished using a circuit having a power MOSFET as the switch. Circuits using a power MOSFET as a switch are well known in the art. The circuit which is the subject of this invention employs a power MOSFET, but includes a unique bias and gate drive configuration with advantages which will become apparent. The circuit of the invention has great utility as a drain pulser for a solid state transmitter, but may find application in other situations requiring fast switching of a DC power voltage.

In many prior art circuits for gating the power to the drain of a solid state amplifier, such as the circuit in FIG. 1, a P-channel power MOSFET (100 in FIG. 1) is used as the drain switch. Vout in FIG. 1 is connected to the drain of a microwave amplifier. Use of a P-channel power MOSFET is convenient because it can be turned on by pulling its gate voltage to Ground. No additional bias voltages are required. However, the use of an N-channel power MOSFET as the drain switch in this application would be more desirable since the lower on-state resistance of the N-channel MOSFET would result in lower power losses and higher efficiency. Additionally, N-channel MOSFETs can be made smaller for equivalent on-state resistance, and so have faster switching capabilities. Unfortunately, N-channel MOSFETs have been considered impractical in this application since the gate bias voltage required is more positive than the input power voltage. For example, if the input power voltage were 10 V, a bias voltage of 15 or 20 V would be required at the gate terminal of a N-channel power MOSFET drain switch. The additional expense and effort associated with providing this extra power supply voltage and connection is highly undesirable.

Some prior art circuits have attempted to use an N-channel power MOSFET in a common drain connection (as is required here) for switching through the use of a control circuit which generates the needed gate bias potential through a charge pump scheme. One such prior art circuit is shown on page 77 of "High Frequency Switching Power Supplies" by George Chryssis, McGraw Hill, 1984, and reproduced here in FIG. 2. The N-channel Power MOSFET 200, which would be the drain switch, acts as the output switch, while transistor 202 pulls down the output when SVin goes high. Transistor 204 acts to pull down the gate of the drain switch transistor 200 when SVin goes high. When SVin goes low, the gate of 200 is pulled up by resistor 208 and the drain switch starts to turn on. The capacitor in this circuit acts as a charge pump providing positive bias and turning 200 fully on.

However, this circuit has several problems that prevent proper function of the circuit in a high-pulse rate radar application. First, during the off-state (when SVin is low), the input voltage Vin is applied across resistor 208. This wastes power and forces the use of a large value resistor 208, considerably slowing the switching speed. Second, turn-on of this circuit occurs in a two-step process since the charge pump gate drive is bootstrapped from the output. The two-step turn-on increases the response time of the circuit. Finally, shoot-through currents can occur between drain switch transistor 200 and transistor 202, wasting significant power during high frequency operation. Thus, the circuit of FIG. 2 will not operate at the high pulse rates required for modern radar applications.

SUMMARY OF THE INVENTION

Therefore, it is a general object of the present invention to provide a novel control circuit for applying a pulsed DC power signal to a power output.

A further object of the present invention is to provide a novel control circuit that uses an N-channel switching device to control application of a power signal to an output of the control circuit.

Yet another object of the present invention is to provide a novel control circuit that operates using a single power supply input.

Another object of the present invention is to provide a novel control circuit that operates at high frequency with relatively lower power losses and/or faster switching times than provided by prior art circuits.

It is another object of the present invention to provide a control circuit that uses a charge pumping device to bias a switching device for transmission of power to an output of the control circuit.

A further object of the present invention is to provide a power switching circuit including a single-voltage power supply and a charge pumping device which temporarily generates a bias voltage in addition to the voltage of the power supply for activating an N-channel switching device.

It is also an object of the present invention to provide a power switching circuit which includes a capacitor for storing a charge which is applied to an N-channel MOSFET switching device to temporarily bias the MOSFET so that the MOSFET transmits power to an output of the power switching circuit.

Another object of the present invention is to provide a power switching circuit which includes latching circuitry for selectively connecting a charge storage device to the gate terminal of an N-channel switching device to bias the device for power transmission to an output of the power switching circuit.

Yet another object of the present invention is to provide a power switching circuit for switching a direct current at a high frequency of the type including a MOSFET for switching said current and a control voltage source connected to a gate terminal of said MOSFET, wherein the maximum voltage available is insufficient to bias an N-channel MOSFET for active operation, in which an N-channel MOSFET is used to switch said current, and a charge pumping circuit connected between said control voltage source and the gate terminal of said MOSFET momentarily raises the maximum voltage generated by said control voltage source to a level sufficient to bias said N-channel MOSFET for active operation.

A final object of the invention is to provide a power switching circuit as heretofore described wherein the charge pumping circuit includes two complementary transistor switches, which may be MOSFETs of opposite polarities, for connecting the gate terminal of the N-channel MOSFET to the voltages associated with both a capacitor in the charge pumping circuit and the control voltage source in order to temporarily bias the N-channel MOSFET into a conductive state.

Other objects and advantages of the present invention will be apparent from the description herein, and from the claims and drawings read in conjunction therewith.

These objects and others are achieved by an electronic drain pulsing circuit designed to intermittently apply electric power to the drain of a solid state amplifier using an N-channel MOSFET as the drain switch, but that does not require an external bias voltage to drive the drain switch gate. The gate bias is provided during each "on" pulse by a latching charge pumping circuit. The charge pumping circuit is part of the gate drive circuitry, and includes a switched-voltage controlled pumping capacitor that stores a charge during an off cycle, and a pair of complementary transistor switches. The switches connect the voltage associated with the charge in the capacitor, and the voltage associated with the control signal (which is used to temporarily "pump" the capacitor charge to a higher voltage) to the gate of the N-channel MOSFET, which biases the N-channel MOSFET drain switch to an on-state. The use of such complementary transistor switches enhances the switching speed of the circuit of the invention, and obviates the need for directing the drive current through a power dissipating resistor during the off-state of the circuit.

BRIEF DESCRIPTION OF THE SEVERAL FIGURES

DETAILED DESCRIPTION OF THE PREFERRED EMBODIMENT

Figure 3:
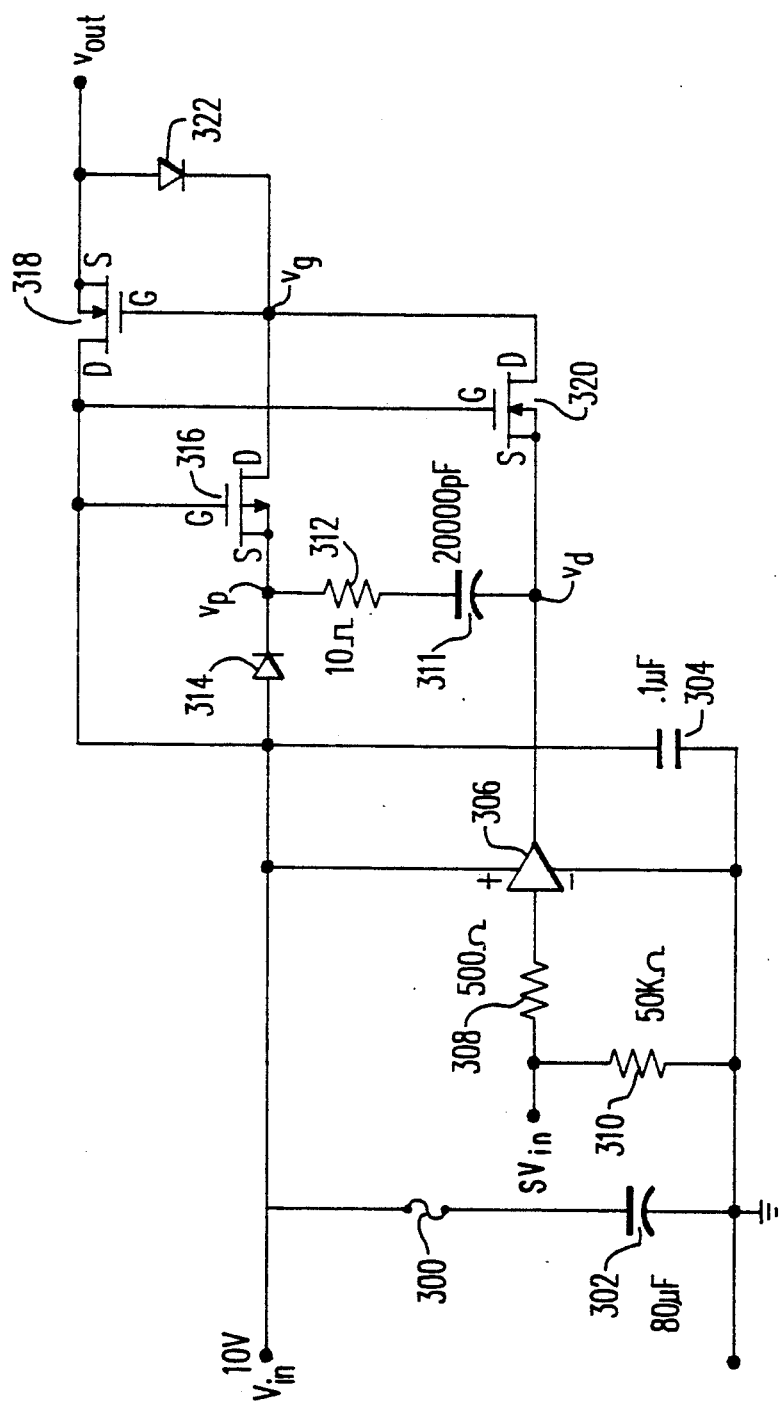
FIG. 3 is a schematic diagram of the circuit of the present invention.

The circuit of the present invention is shown in detail in FIG. 3. The circuit comprises decoupling and filter capacitor 302, ceramic decoupling and filter capacitor 304, fuse 300, which serves to protect against a short in capacitor 302, a line driver 306, input resistor 308, pulldown resistor 310, pumping capacitor 311, current limiting resistor 312, charging diode 314, P-channel MOSFET 316, drain switch 318, N-channel MOSFET 320, and output pulldown diode 322. The P-channel MOSFET 316, the N-channel MOSFET 320, and the drain switch 318, which is a large N-channel MOSFET, each have source, drain, and gate terminals. The drain switch 318 may be an IRFC040 N-channel power MOSFET, while the N-channel MOSFET 320 may be an IRFC1Z0 N-channel MOSFET and the P-channel MOSFET 316 may be an IRFC9110 P-channel MOSFET, all manufactured by International Rectifier located in El Segrendo, Calif. The charging diode 314 and the output pulldown diode 322 may be any commercially available diodes that are appropriate for high frequency use, i.e. that offer fast recovery characteristics and low reverse leakage.

The circuit is powered by a power supply voltage Vin, which may be 10 V DC. Fuse 300 and filter capacitor 302 are connected in series between Vin and ground. Ceramic filter capacitor 304 is also connected between Vin and ground.

The positive power terminal of line driver 306 is connected to Vin, while the ground or negative power terminal of line driver 306 is connected to ground. The line driver 306 may be a model TSC427 manufactured by Teledyne. The control input of the line driver 306 is connected through 500 Ohm input resistor 308 to a control input terminal, designated SVin in the drawing. The SVin terminal can be pulled down to ground by a 50K Ohm pulldown resistor 310 connected between the SVin terminal and ground. If the SVin terminal is not driven or is driven to 0 V DC it will be held at ground. This is when a voltage output of approximately 0 V DC is desired at the terminal designated Vout in the diagram. The SVin terminal will be driven to +5 V DC by an external signal when a voltage output of approximately 10 V DC at the terminal Vout is desired.

The output terminal of line driver 306, which will carry either 0 V DC or 10 V DC depending on the state of SVin, is connected to one terminal of a 20000 pF pumping capacitor 311. The second terminal of pumping capacitor 311 is connected to one terminal of 10 Ohm current limiting resistor 312. The second terminal of current limiting resistor 312 is connected to the cathode of charging diode 314. The anode of the charging diode 314 is connected to the Vin terminal. The second terminal of current limiting resistor 312 is also connected to the source of the P-channel MOSFET 316.

The output of the line driver 306 is also connected to the source of N-channel MOSFET 320. The gates of both N-channel MOSFET 320 and P-channel MOSFET 316 are connected to the power supply voltage Vin. The drains of both the N-channel MOSFET 320 and the P-channel MOSFET 316 are connected to the gate of drain switch 318. The drain of drain switch 318 is connected to the power supply voltage Vin. The source of drain switch 318 is connected to an output terminal designated Vout, which may be connected to the drain of a solid state microwave amplifier (not shown). In a typical application to a GaAs X-band amplifier, the desired value of Vout when Vout is activated is 10 V DC.

The output pulldown diode 322 is connected between the output terminal Vout and the gate of drain switch 318. The voltage at the gate of drain switch 318 will be referred to as Vg. The voltage at the source of P-channel MOSFET 316 will be referred to as the pumping voltage Vp and the voltage at the source of N-channel MOSFET 320 will be referred to as Vd.

In operation, SVin is the on/off signal controlling the drain pulser circuit of the present invention. When SVin is in a high state (+5 V) the drain switch is turned on and Vout is equal to Vin. When SVin is in a low state (0 V) the drain switch is off and Vout is 0 volts. The on/off signal is buffered through line driver 306, creating the voltage Vd. Vd is switched between ground and Vin through line driver 306's totem pole output. Pull-down resistor 310 prevents the possibility of having a 'floating' signal present at SVin and ensures that Vout is 0 volts if SVin is disconnected. Filter capacitor 302 and ceramic filter capacitor 304 provide noise immunity, and energy storage for the pulsed load.

While Vd is low (SVin=0), N-channel MOSFET 320 is on, providing a path from source to drain of N-channel MOSFET 320, pulling Vg to ground and turning off drain switch 318. Vout is actively pulled to ground through output pulldown diode 322. Pumping capacitor 311 is charged up to Vin through charging diode 314. The P-channel MOSFET 316 is off.

When Vd goes high (SVin+5 volts), Vp is "pumped" up to approximately 2 times the value of Vin by the addition of the voltage stored in pumping capacitor 311 to the voltage Vd (it has been empirically shown that Vp gets pumped to approximately 17 volts, i.e. the pumping voltage of pumping capacitor 311 is about 7 volts). The voltage Vp turns on P-channel MOSFET 316, providing a path from source to drain of P-channel MOSFET 316, connecting Vg to Vp. The drain switch 318 turns on in response to the provision of a high bias voltage generated by the connection of pumping capacitor 311 to its gate terminal. Vout is then equal to Vin and N-channel MOSFET 320 is turned off. Thus, the N-channel MOSFET 320 and the P-channel MOSFET 316 act as latching devices to switch the pumping capacitor 311 in and out of the gate biasing circuit for drain switch 318 depending on the logic value of the control input SVin.

During the turn-on and turn-off transitions, N-channel MOSFET 320 and P-channel MOSFET 316 may both conduct for an instant. This current pulse magnitude is limited by current limiting resistor 312.

The "on" state relies on charge stored in pumping capacitor 311 to maintain gate bias at P-channel MOSFET 316. Due to leakage current, the level necessary to bias drain switch 318 will not last indefinitely. A few milliseconds of operation in each cycle is possible with the components listed. Longer pulses at Vout are realizable by increasing the value of pumping capacitor 311.

Figure 4A:
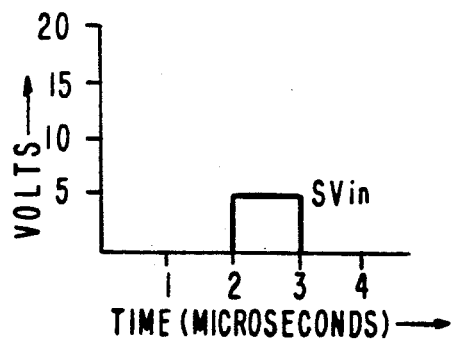
FIG. 4A through 4E are timing diagrams showing typical voltage waveforms for the present invention.
Figure 4B:
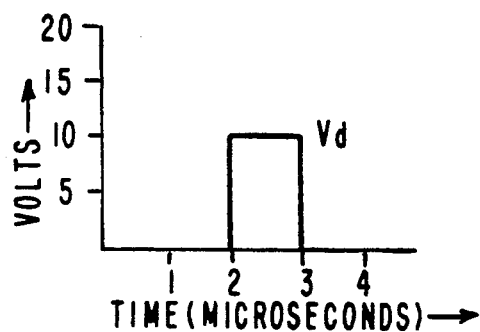
Figure 4C:
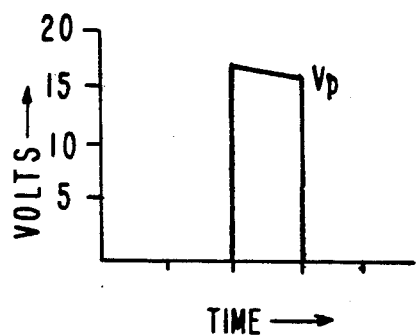
Figure 4D:
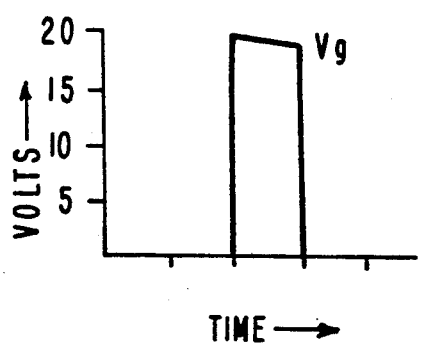
Figure 4E:
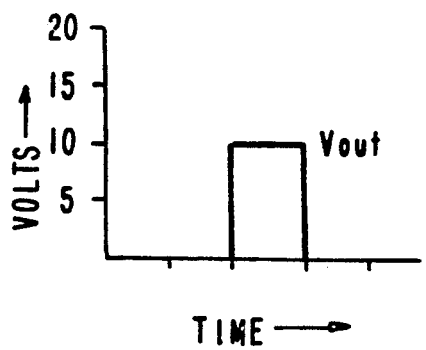

Typical switching waveforms are illustrated in FIGS. 4A-4E. The input control signal SVin is illustrated in FIG. 4A, and the resulting voltage waveforms at points Vd, Vp, Vg and Vout in the circuit are illustrated in FIGS. 4B, 4C, 4D and 4E. Vp and Vg have a slight downward slope due to leakage current discharged from capacitor 311. Depending on the application, the duration of each pulse may be from between a 0.100 microseconds to 1 millisecond. For the shorter pulses, the pulse repetition rate may be as high as 500 kilohertz.

Figure 1:
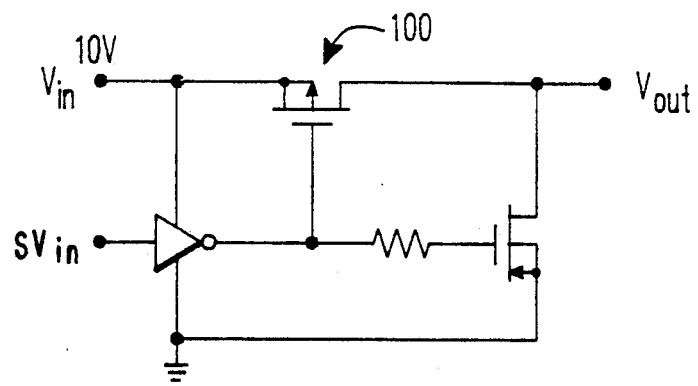
FIG. 1 is a schematic diagram of a prior art DC power drain switch for a solid state amplifier.
Figure 2:
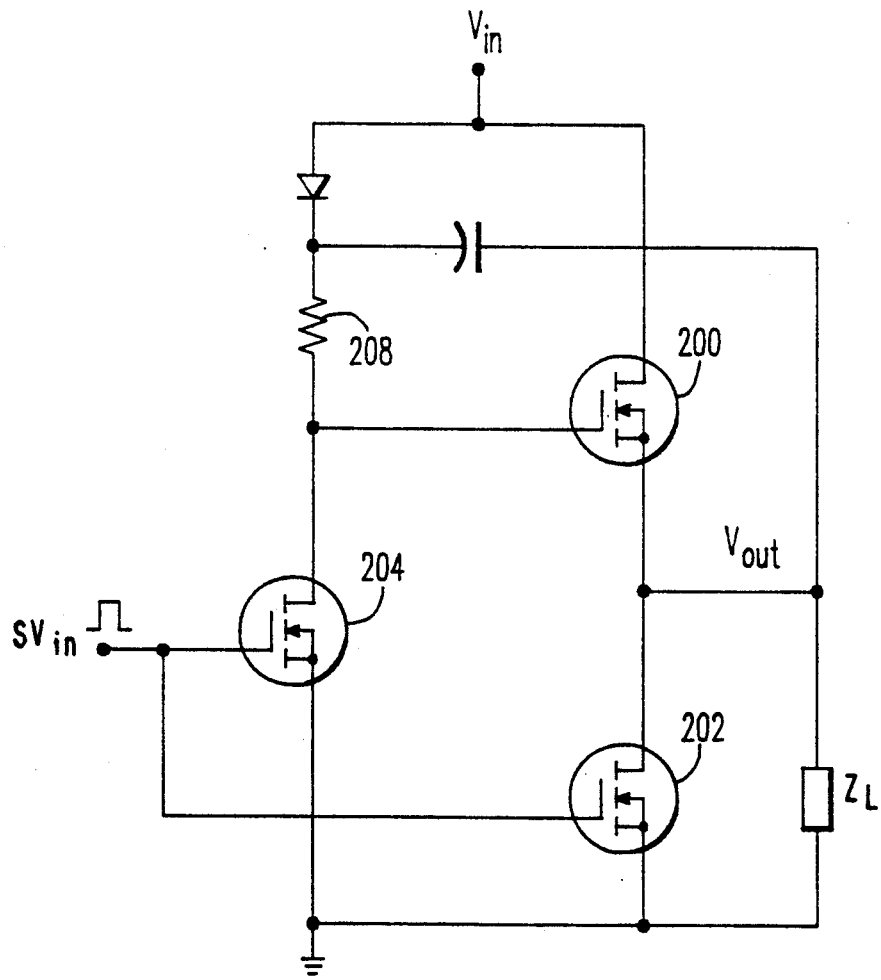
FIG. 2 is a schematic diagram of a second prior art circuit for switching power to an output voltage.

Thus, a drain pulsing circuit has been disclosed which has lower losses than the commonly used P-channel MOSFET "drain pulser" circuit of FIG. 1, uses an N-channel FET in the common drain configuration without requiring a separate bias supply to drive its gate, and which switches more quickly and efficiently than the prior art circuit of FIG. 2.

STATEMENT OF INDUSTRIAL APPLICABILITY

The present invention is an electronic power switching circuit with many potential applications. The circuit has particular application in the control of power to the drain of a solid-state microwave amplifier used in radar applications.

I claim:

1. A control circuit for applying a power signal from a power source to a power output at a high switching frequency, comprising:
   a. N-channel switching means connected to the power source, having a control gate, for selectively transmitting the power signal to the power output of the control circuit during an active state which is entered in response to a gate bias voltage applied to the gate;
   b. control input means for receiving a power application signal indicating that power is to be applied to the power output and for providing a control signal in response thereto;
   c. a charge pumping circuit connected to the control input means and the gate of the N-channel switching means comprising a capacitor for storing a stored charge and first and second complementary transistor switching means for applying the stored charge to the gate of the N-channel switching means upon receipt of the control signal provided by the control input means, so as to temporarily increase said gate bias voltage to the N-channel switching means, thus causing the N-channel switching means to enter its active state.

2. The control circuit of claim 1 wherein the first and second complementary transistor switching means are MOSFETs of different polarities.

3. The control circuit of claim 2 wherein the control input means receiver said power signal such that the voltage of the control signal generated by the control input means is the same as the voltage of the power signal when said power application signal is received by the control input means.

4. The control circuit of claim 1, wherein the transistor switching means of the charge pumping circuit additively connects both the charge of the capacitor and the voltage associated with the control signal to the gate of the N-channel switching means to cause the N-channel switching means to enter its active state.

5. The control circuit of claim 1, wherein one of the first and second the transistor switching means connects the gate of the N-channel switching means to a ground means until said control input means provides said control signal.

6. The control circuit of claim 1, wherein the first of said transistor means has a gate, an input and an output, and is connected between said capacitor and the gate of the N-channel switching means, while the second of said transistor switching means has a gate, an input and an output, and is connected between the gate of the N-channel switching means and a ground means.

7. The control circuit of claim 6, wherein the output of the first transistor switching means is further connected in series with the input of the second transistor switching means.

8. The control circuit of claim 7, wherein the gates of both the first and second transistor switching means are connected in parallel to the power source, and wherein the polarities of the two transistor switching means are opposite from one another.

9. The control circuit of claim 8, wherein the voltage associated with the power source biases the second transistor switching means into a conductive state when the output of the first transistor switching means does not apply a voltage to the input of said second transistor switching means such that the second transistor switching means connects the gate of the N-channel switching means to said ground means.

10. The control circuit of claim 9, wherein the additive application of the voltage from the capacitor and the voltage associated with the control signal to the input of the first transistor is sufficient to bias the first transistor means from a non-conductive to a conductive state, and to thereby apply said additive voltages to both the gate of the N-channel switching means and the input of the second transistor switching means, thereby rendering the former conductive and the latter non-conductive.

11. A power switching circuit for applying a power signal to a power output at a high switching frequency, comprising:
 a. power supply means providing a signal voltage output;
 b. an N-channel power MOSFET having source, drain, and gate terminals, the drain terminal connected to the output of the power supply means, which selectively transmits the output of the power supply means through the source terminal to the power output of the power switching circuit during an active state which is entered in response to application of a gate bias voltage greater than the voltage output of the power supply means to the gate terminal of the power MOSFET, and
 c. a charge pumping circuit including a capacitor for storing a charge and first and second complementary MOSFETs of different polarities for disconnecting the gate terminal of the N-channel power MOSFET from a ground means and connecting said gate terminal to the voltage associated with said capacitor charge upon receipt of an external control signal thus temporarily applying a gate bias voltage greater than the voltage output of the power supply means to the gate terminal of the power MOSFET to render the power MOSFET conductive, wherein the power applied to create the gate bias voltage is provided by a single said signal voltage output of the power supply means.

12. The control circuit of claim 11, further comprising a control input means for receiving a signal indicating that power is to be applied to the power output and for providing said control signal to said charge pumping circuit.

13. The control circuit of claim 2 wherein the control input means is connected to said power signal such that the voltage of the control signal generated by the control input means is the same as the voltage of the power signal when said power application signal is received by the control input means.

14. The control circuit of claim 13, wherein said control input means is an in-line driver with an output is connected to said capacitor.

15. The control circuit of claim 14, wherein the gate of said first complementary MOSFET is connected to the power input, and the source of said MOSFET is connected to the combined output of said capacitor and said driver such that said first complementary MOSFET is rendered conductive whenever said driver generates a control signal, and operates to additively conduct the voltages associated with both said capacitor charge and said control signal to the gate of said N-channel power MOSFET.

16. The control circuit of claim 15, further comprising a resistor means connected between the output of the capacitor and the source of said first MOSFET for limiting the current applied to said first MOSFET.

17. The control circuit of claim 11, wherein said capacitor is connected between said power signal and a ground means such that said capacitor stores a charge.

18. The control circuit of claim 15, wherein the gate of the second complementary MOSFET is connected to the power input, and the source and drain of said second MOSFET is connected between said ground means and the gate terminal of said N-channel power MOSFET.

19. The control circuit of claim 18, wherein said drain of said second MOSFET is also connected to the drain of the first MOSFET such that when said second MOSFET conducts said additive voltages associated with said capacitor charge and said control signal, said first MOSFET is rendered non-conductive.

20. The control circuit of claim 11, wherein said first and second complementary MOSFETs are a P-channel and an N-channel MOSFET respectively.

* * * * *